United States Patent
Chang et al.

(10) Patent No.: US 9,305,741 B2
(45) Date of Patent: Apr. 5, 2016

(54) DESKTOP ELECTRON MICROSCOPE AND WIDE RANGE TUNABLE MAGNETIC LENS THEREOF

(71) Applicant: NATIONAL TSING HUA UNIVERSITY, Hsinchu (TW)

(72) Inventors: Wei-Yu Chang, Hsinchu (TW); Fu-Rong Chen, Hsinchu (TW); Te-Hui Lee, Hsinchu (TW); Tsu-Wei Huang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/531,011

(22) Filed: Nov. 3, 2014

(65) Prior Publication Data
US 2016/0042910 A1 Feb. 11, 2016

(30) Foreign Application Priority Data

Aug. 8, 2014 (TW) ............................. 103127296 A

(51) Int. Cl.
*H01J 37/141* (2006.01)
*H01J 37/26* (2006.01)
*H01J 37/145* (2006.01)

(52) U.S. Cl.
CPC ............ *H01J 37/141* (2013.01); *H01J 37/145* (2013.01); *H01J 37/1413* (2013.01); *H01J 37/26* (2013.01); *H01J 2237/141* (2013.01)

(58) Field of Classification Search
None
See application file for complete search history.

(56) References Cited

U.S. PATENT DOCUMENTS

| 3,818,394 | A | * | 6/1974 | Katagiri et al. ............... 335/210 |
| 3,984,687 | A | * | 10/1976 | Loeffler ................. H01J 37/09 250/396 ML |
| 4,419,581 | A | * | 12/1983 | Nakagawa ............... H01J 37/28 250/396 ML |
| 4,806,766 | A | * | 2/1989 | Chisholm ............... 250/396 ML |
| 5,334,910 | A | * | 8/1994 | Karsten et al. ............... 315/5.35 |
| 6,002,135 | A |  | 12/1999 | Veneklasen et al. |
| 6,057,553 | A | * | 5/2000 | Khursheed et al. ....... 250/442.11 |
| 6,320,194 | B1 | * | 11/2001 | Khursheed et al. ....... 250/442.11 |
| 7,928,405 | B2 | * | 4/2011 | Adamec et al. .......... 250/396 ML |
| 2002/0074495 | A1 | * | 6/2002 | Notte, IV ....................... 250/311 |
| 2002/0074524 | A1 | * | 6/2002 | Nakano .................. B82Y 10/00 250/505.1 |
| 2003/0205678 | A1 | * | 11/2003 | Notte, IV .................... 250/423 F |

(Continued)

FOREIGN PATENT DOCUMENTS

| CN | 1404617 A | 3/2003 |
| CN | 1590979 A | 3/2005 |

(Continued)

Primary Examiner — Michael Logie
(74) Attorney, Agent, or Firm — Li & Cai Intellectual Property (USA) Office

(57) ABSTRACT

A wide range tunable magnetic lens for the desktop electron microscope is provided. The wired range tunable magnetic lens comprises a coil support, an inner pole piece, a permanent-magnet, a first outer pole piece and a second outer pole piece. The inner pole piece covers the coil support and forms a first magnetic-circuit gap. The permanent-magnet forms a ring structure according to the central axis and is disposed at the outer side of the inner pole piece away from the central axis. The first outer pole piece is adjacently disposed at the upper-side of the permanent-magnet and extends to the central hole of the coil support. The second outer pole piece is adjacently disposed at the under-side of the permanent-magnet and extends to the central hole of the coil support, wherein the first outer pole piece and the second outer pole piece forms a second magnetic-circuit gap.

17 Claims, 8 Drawing Sheets

(56) References Cited

U.S. PATENT DOCUMENTS

| | | | |
|---|---|---|---|
| 2004/0084629 A1* | 5/2004 | Preikszas | H01J 37/145 250/396 R |
| 2004/0211914 A1* | 10/2004 | Buijsse | 250/398 |
| 2005/0236568 A1* | 10/2005 | Buijsse et al. | 250/310 |
| 2008/0067396 A1* | 3/2008 | Ohshima et al. | 250/396 ML |
| 2008/0099674 A1* | 5/2008 | Bihr et al. | 250/307 |
| 2009/0159810 A1* | 6/2009 | Knippelmeyer et al. | 250/396 ML |
| 2010/0038538 A1* | 2/2010 | Drexel | 250/311 |
| 2010/0090579 A1* | 4/2010 | Sellmair | 313/160 |
| 2012/0300500 A1* | 11/2012 | Ikriannikov | H01F 3/10 363/16 |

FOREIGN PATENT DOCUMENTS

| TW | 200931183 A | 7/2009 |
|---|---|---|
| TW | 201419360 A | 5/2014 |
| WO | WO 01/56056 A2 | 8/2001 |

\* cited by examiner

DESKTOP ELECTRON MICROSCOPE AND WIDE RANGE TUNABLE MAGNETIC LENS THEREOF

BACKGROUND OF THE INVENTION

1. Field of the Invention

The instant disclosure relates to a magnetic lens; in particular, to a wide range tunable magnetic lens.

2. Description of Related Art

In recent years, the demand for observation of biological samples has increased due to the development of biotechnology. The electron microscope has been used to observe the biological samples, but surface charge accumulation on samples occurs due to the high accelerating voltage. At present, a method of decreasing the accelerating voltage for electrons has been adopted, in which the accelerating voltage is typically ranged from 0.5 kV to 5 kV. In general, the desktop electron microscope utilizes a permanent magnetic lens to replace the conventional coil magnetic lens, but will simultaneously lose the tunable ability under different accelerating voltages.

The focusing power of a magnetic field is proportional to the root of the accelerating voltage. As in FIG. 1, the horizontal axis shows the accelerating voltage (1 kV per unit), and the vertical axis shows the magnetic excitation increment. The magnetic excitation increment corresponding to the accelerating voltage increasing from 1 kV to 2 kV is about three times of the magnetic excitation increment corresponding to the accelerating voltage increasing from 14 kV to 15 kV.

SUMMARY OF THE INVENTION

The object of the instant disclosure is to provide a desktop electron microscope and a wide range tunable magnetic lens thereof, in order to resolve the limitation of tunable focusing ability for the magnetic lens of the electron microscope.

In order to achieve the aforementioned objects, according to an embodiment of the instant disclosure, a desktop electron microscope is offered. The desktop electron microscope comprises an electron gun and at least a wide range tunable magnetic lens. The electron gun is for providing an electron beam. The wide range tunable magnetic lens comprises a coil support, an inner pole piece, a permanent magnet, a first outer pole piece and a second outer pole piece. The coil support is for winding a coil according to a central axis. The center of the coil support has a central opening for the electron beam passing through the central opening. The inner pole piece covers the coil support, and has an inner top pole shoe and an inner down pole shoe. The inner top pole shoe and the inner down pole shoe are located at the central opening of the coil support for forming a first magnetic-circuit gap. The permanent magnet forms an annular structure according to the central axis. The permanent magnet is disposed at the outer side of the inner pole piece away from the central axis. The first outer pole piece is adjacently disposed at an upper-side of the permanent-magnet, and extends to the central hole of the coil support for forming a first outer pole shoe. The second outer pole piece is adjacently disposed at the under-side of the permanent-magnet, and extends to the central hole of the coil support for forming a second outer pole shoe, wherein the first outer pole shoe and the second outer pole shoe forms a second magnetic-circuit gap.

In order to achieve the aforementioned objects, according to an embodiment of the instant disclosure, a wide range tunable magnetic lens is offered. The wide range tunable magnetic lens comprises a coil support, an inner pole piece, a permanent magnet, a first outer pole piece and a second outer pole piece. The coil support is for winding a coil according to a central axis. The center of the coil support has a central opening for the electron beam passing through the central opening. The inner pole piece covers the coil support, and has an inner top pole shoe and an inner down pole shoe. The inner top pole shoe and the inner down pole shoe are located at the central opening of the coil support for forming a first magnetic-circuit gap. The permanent magnet forms an annular structure according to the central axis. The permanent magnet is disposed at the outer side of the inner pole piece away from the central axis. The first outer pole piece is adjacently disposed at an upper-side of the permanent-magnet, and extends to the central hole of the coil support for forming a first outer pole shoe. The second outer pole piece is adjacently disposed at the under-side of the permanent-magnet, and extends to the central hole of the coil support for forming a second outer pole shoe, wherein the first outer pole shoe and the second outer pole shoe forms a second magnetic-circuit gap.

In summary, the provided desktop electron microscope and the wide range tunable magnetic lens thereof utilize the magnetic field from the magnet as the base, and the magnetic field generated by coils can be adjusted up or down based on this base. By combining the permanent magnet and the coil lens without increasing the volume of the lens, the tunable ability of magnetic lens can be effectively enhanced.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
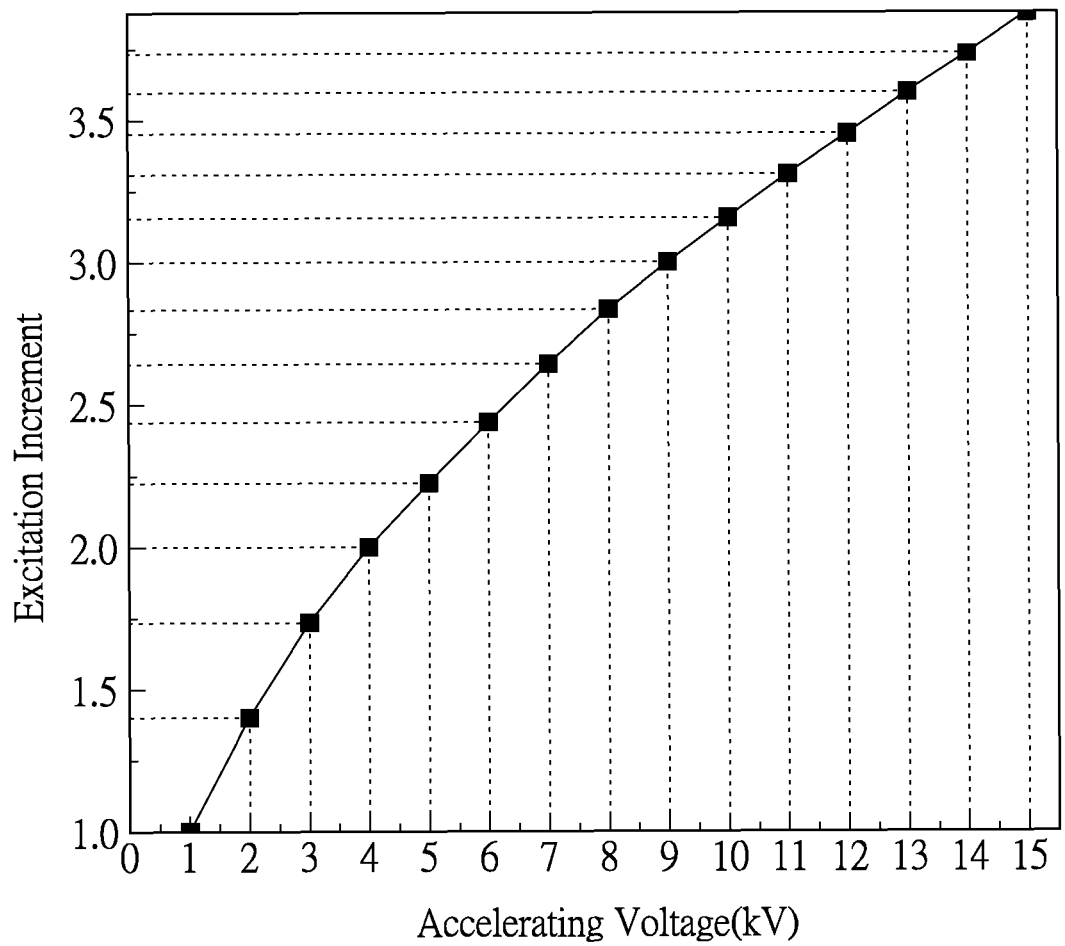
FIG. 1 shows a diagram of the conventionally correspondence between the accelerating voltage of the electron beam and the excitation increment for altering the focus ability.
Figure 2:
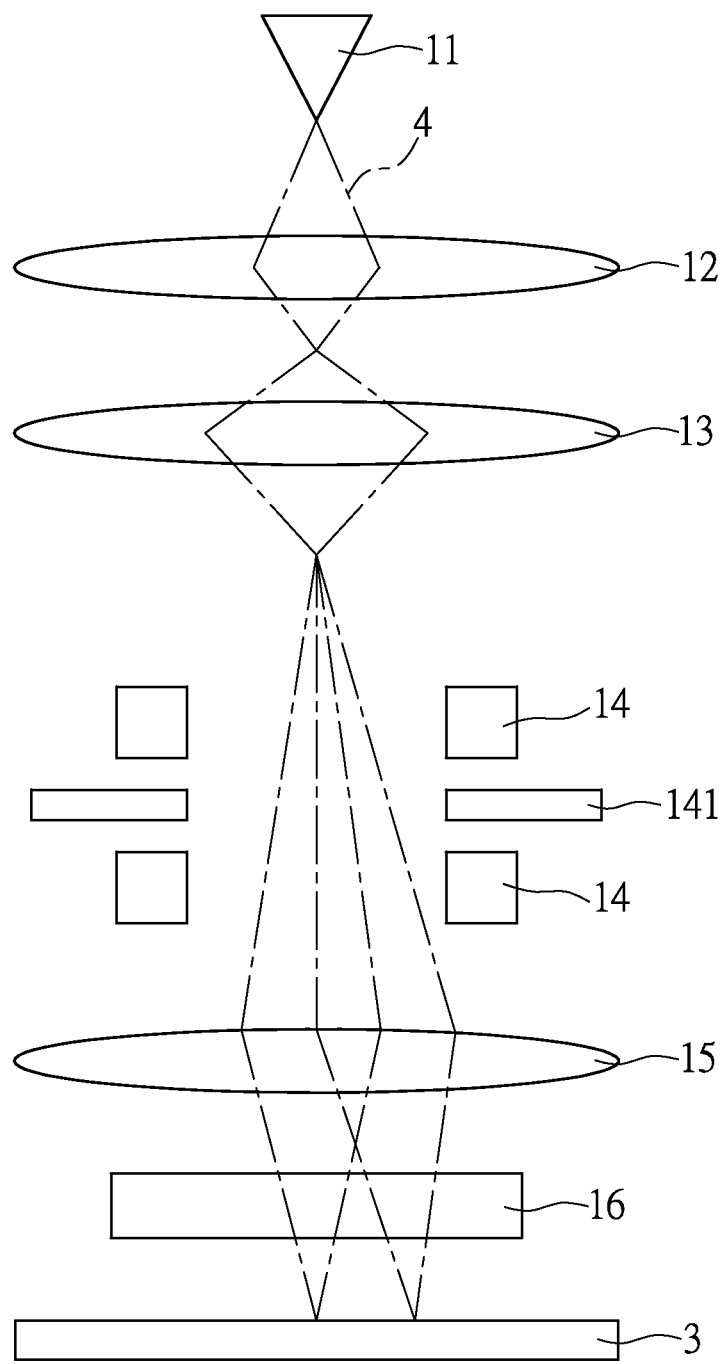
FIG. 2 shows a schematic diagram of a conventional electron microscope.

An Embodiment of the Desktop Electron Microscope and the Wide Range Tunable Magnetic Lens Thereof Please refer to FIG. 2 showing a schematic diagram of a conventional electron microscope. The electron microscope comprises an electron gun 11 and a plurality of lens 12, 13, 141, 15. The mentioned lens may be magnetic lens or electric lens. The lens 12, 13 may be focus lens, the lens 141 may be aberration correction lens (which is cooperated with the electron deflector 14), and the lens 15 is an objective lens. After passing the lens 15 and the detector 16, the electron beam 4 hits the target 3, and depending on the type of the electron microscope the electron microscope can be the scanning electron microscope (SEM) or the transmission electron microscope (TEM). Whatever the type the electron microscope is, the design of the lens greatly affects the performance of the electron microscope. The characteristic of the desktop electron microscope and the wide range tunable magnetic lens thereof is that it maintains the highest efficiency of generating magnetic field of the coil while utilizing the permanent magnetic field.

This embodiment provides a desktop electron microscope comprising an electron gun 11 shown in FIG. 2 and at least a wide range tunable magnetic lens. The type of the wide range tunable magnetic lens is not restricted in the instant disclosure. The wide range tunable magnetic lens may be a focus lens, an objective lens, an aberration correction lens, a diffraction lens, a projection lens, an intermediate lens . . . , and so on.

Figure 3A:
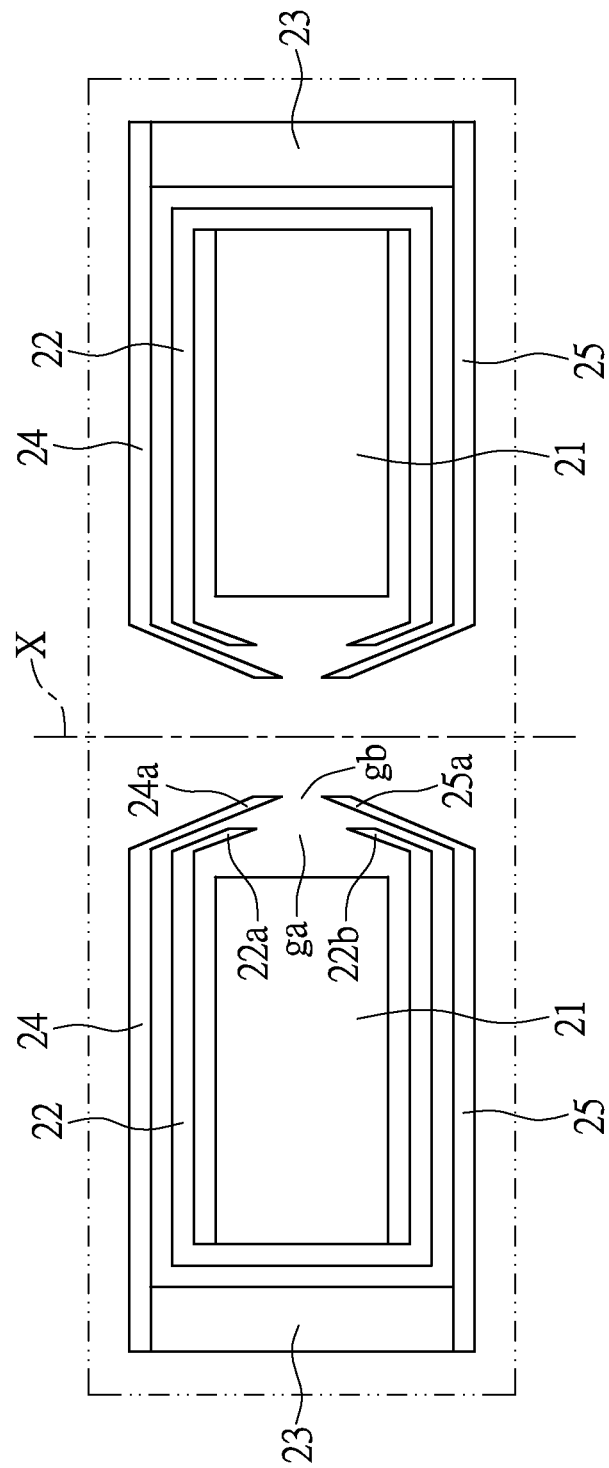
FIG. 3A shows a simplified cross-sectional view of a wide range tunable magnetic lens according to an embodiment of the instant disclosure.
Figure 3B:
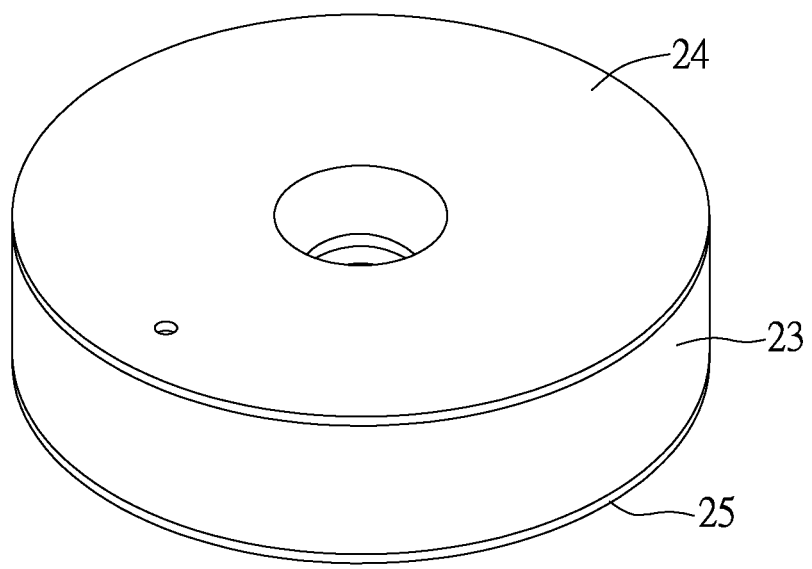
FIG. 3B shows a schematic diagram of a wide range tunable magnetic lens according to an embodiment of the instant disclosure.

For ease of explanation, please refer to FIG. 3A showing a schematic diagram of a wide range tunable magnetic lens and FIG. 3B showing a schematic diagram of a wide range tunable magnetic lens. The wide range tunable magnetic lens comprises a coil 21 (the coil 21 is winding on a coil support), an inner pole piece 22, a permanent magnet 23, a first outer pole piece 24 and a second outer pole piece 25. The permanent magnet 23 is disposed at the outer side of the inner pole piece 22 away from the central axis X. The relative positions between the inner pole piece 22 and the permanent magnet 23 can be designed and adjustment can be determined arbitrarily as needed. Under this architecture, the conventional outer pole piece is divided into the separated first outer pole piece 24 and the second outer pole piece 25 due to the arrangement of the permanent magnet 23, therefore the magnetic circuit would be disrupted, and the inner pole piece 22 is responsible for guiding the magnetic field generated by the coil. The inner pole piece 22 forms an inner top pole shoe 22a and an inner down pole shoe 22b. As shown in FIG. 3A, the direction of the magnetic field generated by the permanent magnet 23 at the inner pole pieces and the outer pole pieces are the same as that of the magnetic field generated by the coil 21 fed with forward direction electric current. Also, the magnetic field generated by the coil 21 (fed with electric current) can be effectively held by the inner pole piece. On the other hand, when the coil 21 is fed with inversed direction electric current, the inner pole piece 22 could also achieve guiding the inverse direction magnetic circuit, therefore the inverse direction magnetic circuit would not produce a reversed magnetic field (opposite to the magnetic field of the permanent magnet 23) along the outer pole pieces (24, 25), thus the permanent magnet 23 would not be demagnetized.

Figure 3C:
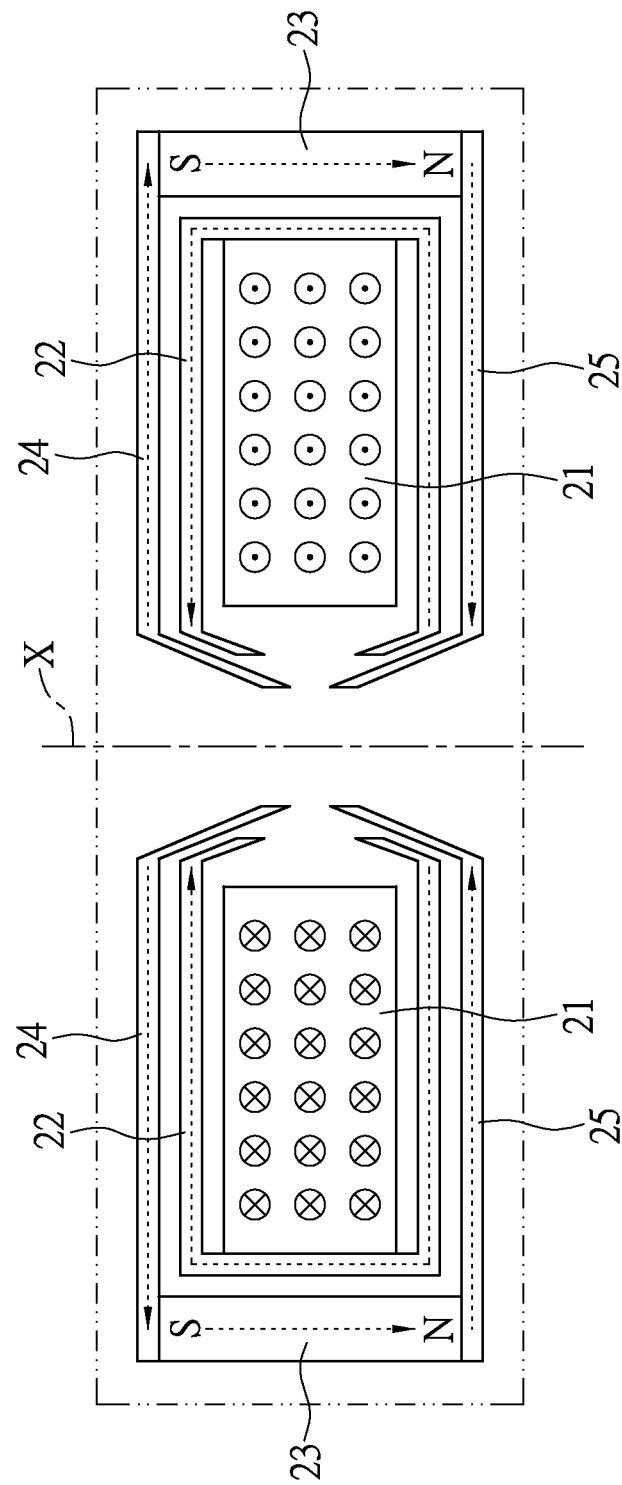
FIG. 3C shows the magnetic field plot of a wide range tunable magnetic lens according to an embodiment of the instant disclosure.

Please refer to FIG. 3C showing the magnetic field plot of a wide range tunable magnetic lens according to an embodiment of the instant disclosure. The positions of the magnetic poles S, N of the permanent magnet 23 shown in FIG. 3 are exemplary, but the instant disclosure is not so restricted. When the coil 21 is fed with an electric current, the inner pole piece 22 is for providing the magnetic circuit in order to guide the variable (or adjustable) magnetic field generated by the coil 21, wherein the electric current fed into the coil 21 may be the forward direction electric current or inversed direction electric current. On the other hand, the first outer pole piece 24 and the second outer pole piece 25 provide another magnetic circuit for guiding the permanent magnetic field generated by the permanent magnet 23.

This technology provides the magnetic field generated by the permanent magnet 23 as the base, and the forward direction or inverse direction magnetic field generated by the electric current on the coil are ensured to be effectively added to the permanent magnetic field, and the permanent magnet 23 would not be easily demagnetized. Also, the magnetic circuit in the inner pole piece 22 is not disrupted, thus the depletion of the magnetic field generated by the coil would be greatly reduced. In this embodiment, the inner pole piece 22, the first outer pole piece 24 and the second outer pole piece 25 may be iron or ferromagnetic metals, but the instant disclosure is not so restricted. Considering the magnitude of generated magnetic field while applying the this technology, taking the needed magnetic field for focusing electrons with accelerating voltage 15 kV of the general desktop electron microscope as an example, the needed magnetic field is about 270 mT. For the conventional design which is the coil cooperating with the conventional pole shoes, the adjustable magnetic field would be about 0-75 mT. In one embodiment, while utilizing the design of this instant disclosure, the range of the adjustable magnetic field would be effectively broaden to 0-160 mT, which is equivalent to about adjusting the focusing electron with accelerating voltage 0-5 kV, even if the volume of the magnetic field is limited. However, the instant disclosure is not restricted thereto. When the volume of the magnetic lens is increased, the adjustable range of the magnetic field would be broadened more.

Figure 4A:
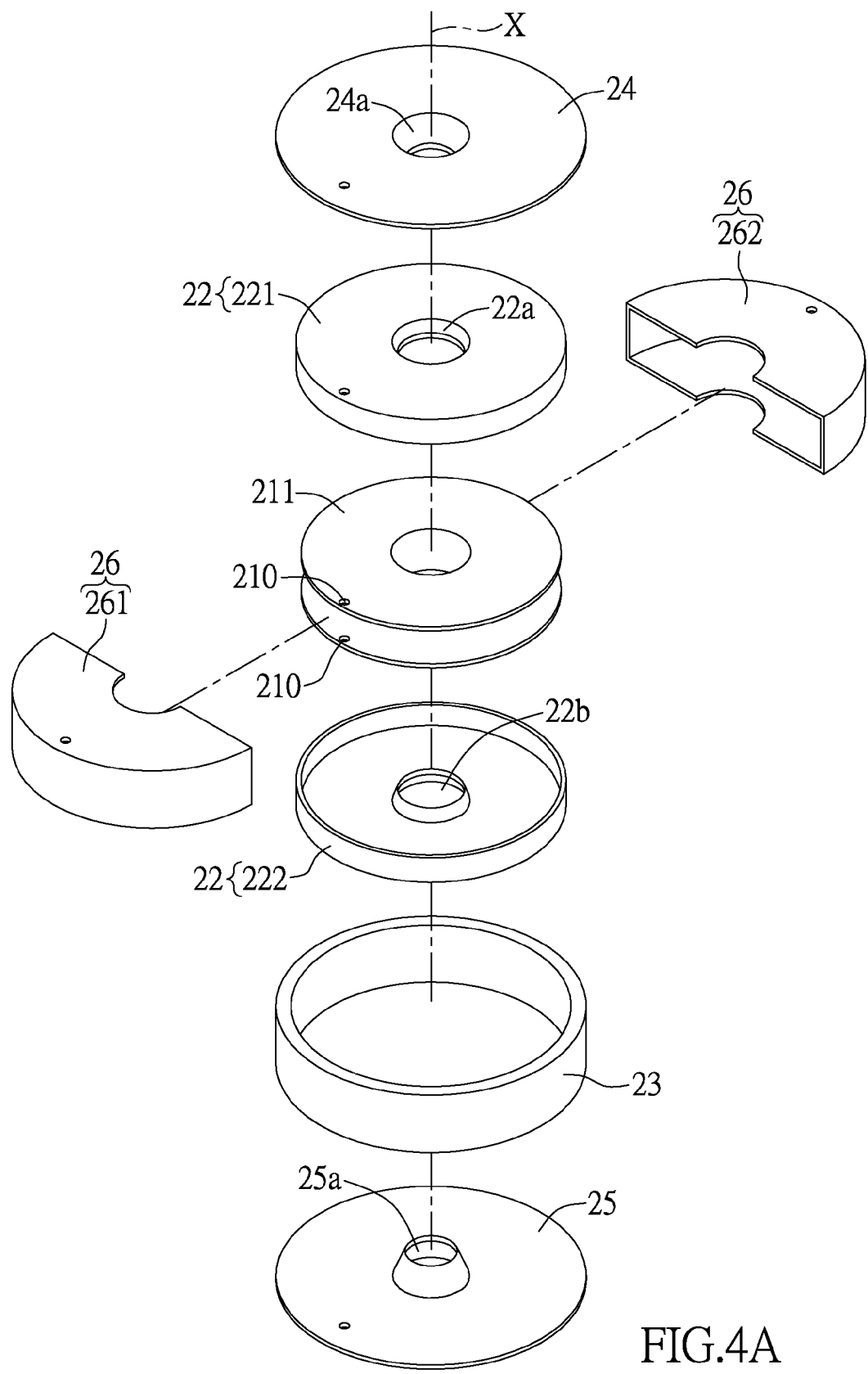
FIG. 4A shows an exploded view drawing of a wide range tunable magnetic lens according to an embodiment of the instant disclosure.
Figure 4B:
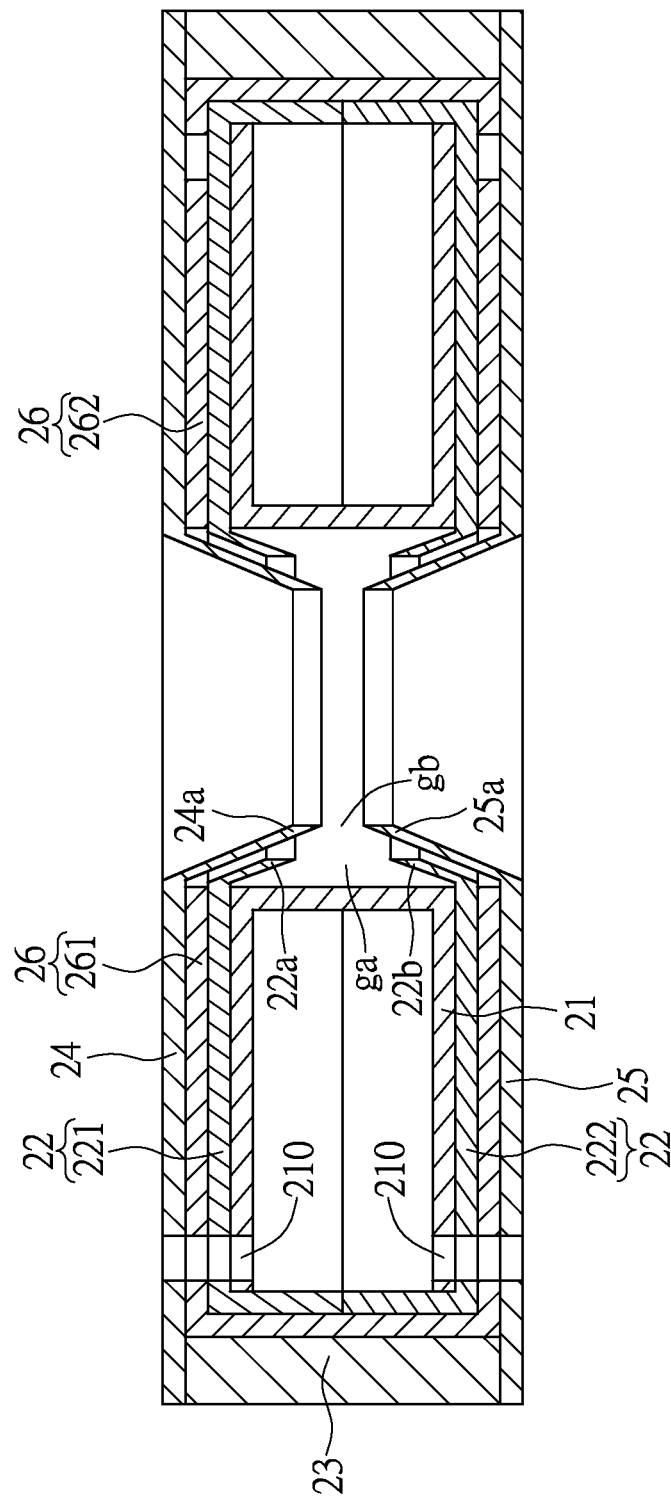
FIG. 4B shows a detailed cross-sectional view of a wide range tunable magnetic lens according to an embodiment of the instant disclosure.

Please refer to FIG. 3A in conjunction with FIG. 4A and FIG. 4B, FIG. 4A shows an exploded view drawing of a wide range tunable magnetic lens according to an embodiment of the instant disclosure, FIG. 4B shows a detailed cross-sectional view of a wide range tunable magnetic lens according to an embodiment of the instant disclosure. A detailed practical embodiment of the wide range tunable magnetic lens is sketched in FIG. 4A and FIG. 4B. The wide range tunable magnetic lens comprises a coil support 211 (for supporting the coil, which is not shown in the figure), an inner pole piece 22, an outer bracket 26, a permanent magnet 23, a first outer pole piece 24 and a second outer pole piece 25. The coil support 211 is made of non-magnetic material. The coil support 211 is for winding a coil according to a central axis X. The center of the coil support 211 has a central opening for the electron beam passing through the central opening (for example, the electron beam may transmit substantially along the central axis X). The inner pole piece 22 covers the coil support 211. In this embodiment, for ease of assembly, the inner pole piece 22 is constituted by two pole elements 211, 222 in combination, however, the assembly and manufacturing of the inner pole piece 22 of the instant disclosure is not so restricted. Also, the instant disclosure does not restrict the shapes of the inner pole shoes and the outer pole shoes.

The inner pole piece 22 has an inner top pole shoe 22a and an inner down pole shoe 22b. The inner top pole shoe 22a and the inner down pole shoe 22b are located at the central opening of the coil support 211 for forming a first magnetic-circuit gap "ga", as shown in the cross-sectional view of FIG. 4B. In another embodiment, the inner pole piece 22 substantially covers the coil support 211 and the corresponding coil except the central opening. It is worth mentioning that the holes 210 on the coil support 211 are for drawing out the two terminals of the coil, and the corresponding positions of the related components also has similar holes.

The outer bracket 26 is disposed between the inner pole piece 22 and the permanent magnet 23. In this embodiment, for ease of assembly, the outer bracket 26 is assembled by two brackets 261, 262, but the instant disclosure is not so restricted. In other words, the outer bracket 26 substantially covers the inner pole piece 22 except the central opening. In this embodiment, the outer bracket 26 is made of non-magnetic material, and the outer bracket 26 does not substantially affect the magnetic circuits caused by other components.

The permanent magnet 23 forms an annular structure according to the central axis X. The first outer pole piece 24 is adjacently disposed at an upper-side of the permanent-magnet 23, and the first outer pole piece 24 extends to the central hole of the coil support 211 for forming a first outer pole shoe 24a. The second outer pole piece 25 is adjacently disposed at the under-side of the permanent-magnet 23, and second outer pole piece 25 extends to the central hole of the coil support 211 for forming a second outer pole shoe 25a, wherein the first outer pole shoe 24a and the second outer pole shoe 25a forms a second magnetic-circuit gap "gb", shown in the cross-sectional view of FIG. 4B.

Figure 5:
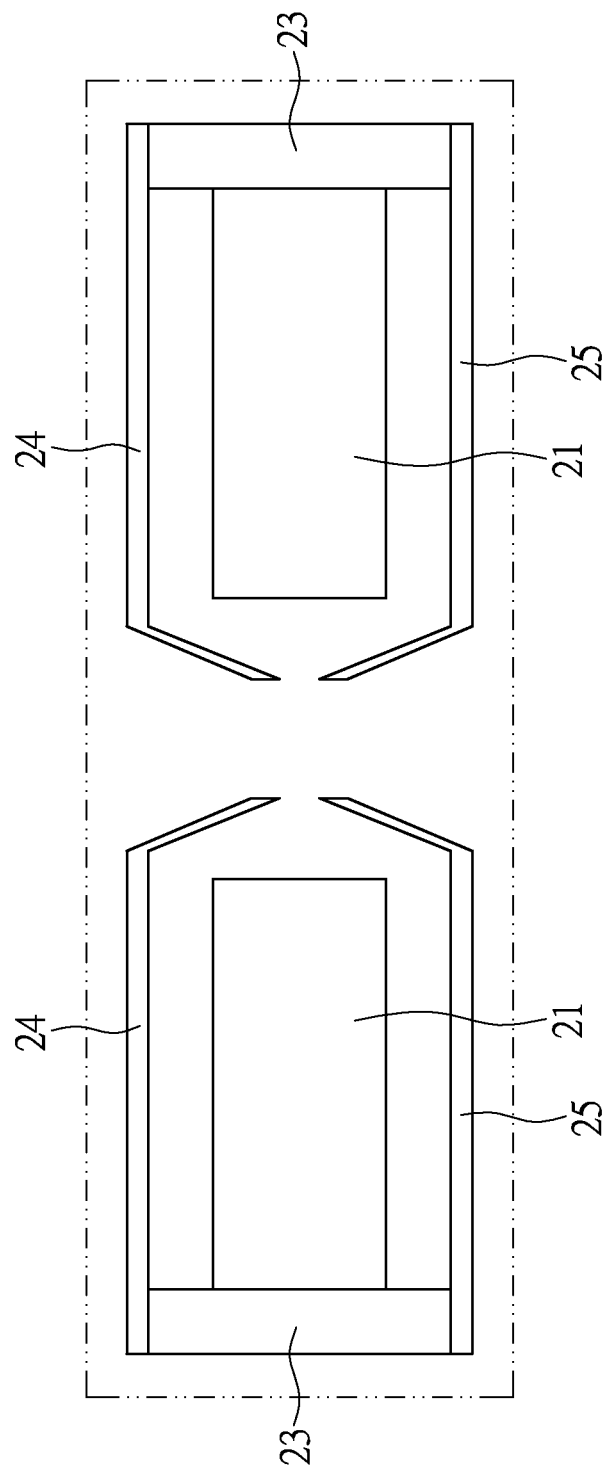
FIG. 5 shows a cross-sectional view of a permanent magnet corresponding to the coil of the wide range tunable magnetic lens according to an embodiment of the instant disclosure.

It is worth mentioning that, in the field of the desktop electron microscope, the accelerating voltage (0-15 KV) of the desktop electron microscope is not as high as that of the conventional scanning electron microscope (0-30 KV) and that of transmission electron microscope (200 KV). Thus, using the coil only or the permanent magnet only can "greatly" adjust the magnetic field for the desktop electron microscope. Referring to FIG. 5, the desktop electron microscope and the wide range tunable magnetic lens of the instant disclosure use the permanent magnet 23 as the base of magnetic field (cooperating with the first outer pole piece 24 and the second outer pole piece 25), and the permanent magnet 23 coordinates with the coil 21 to obtain adjusting the magnetic field in wide range. Base on the architecture shown in FIG. 5, the embodiment and architecture of FIG. 3A can be implemented accordingly, wherein the inner pole piece 22 (an iron shell, for example) is added on the coil in order to ensure the magnetic circuit of the magnetic field generated by the coil would not be disrupted, then the most outer shell (constituted by the permanent magnet 23, the first outer pole piece 24 and the second outer pole piece 25) is the magnetic circuit of the permanent magnet. It is worth mentioning that the conventional large electron microscope has high electron accelerating voltage, such that the coil is only for narrow range tuning of the magnetic field, and it needs added cooling system when increasing the proportion of the coil. The accelerating voltage of the desktop electron microscope of the instant disclosure is relatively low, and the proportion of the coil can be increased based on the design of FIG. 5, thus under the accelerating voltage of the desktop electron microscope the magnetic field generated by the coil 21 can be used for wide range magnetic field adjustment without using any added cooling system. However, the magnitude and the tuning range of the magnetic field generated by the coil of the instant disclosure is not so restricted.

Specifically, the conventional magnetic lens with pole pieces and pole shoes thereof covering the coil only is identical to the inner pole piece 22 covering the coil of the instant disclosure, in which the focusing ability in small volume is quite limited. On the other hand, if the coil is simply replaced by the permanent magnet, the magnetic field of the magnetic field would not be adjusted, though the magnetic field is strong enough. In contrast, according to the design constituted by the permanent magnet 23, the first outer pole piece 24 and the second outer pole piece 25 of this embodiment, utilizing the permanent magnet 23 placed between the magnetic circuit formed by first outer pole piece 24 and the second pole piece 25 can retain the advantages of both the aforementioned situations. Furthermore, this instant disclosure provides the concept of two magnetic circuit layers, wherein the inner magnetic circuit layer is simply the inner pole piece 22 covering the coil and the outer magnetic circuit layer utilizes the permanent magnet 23 as a part of the magnetic circuit. The outer magnetic circuit layer can significantly enhance the magnitude of the magnetic field due to the utilized permanent magnet 23, and the inner magnetic circuit layer can provide the maximum adjustment ability due to the retained completeness of the inner pole piece 22.

According to above descriptions, the provided desktop electron microscope and the wide range tunable magnetic lens thereof utilize the magnetic field from a magnet as the base, and the magnetic field generated by coils can be superimposed on this base. By combining the permanent magnet and the coil lens to form two magnetic circuit layers without increasing the volume of the lens, the tunable ability of the magnetic lens can be effectively enhanced. According to the embodiment of this instant disclosure, the tuning ability of the magnetic field for the magnetic lens can be effectively increased based on the same volume of the magnetic lens, which is adopted to the desktop instrument such as the focusing lens of the electron microscope, the projection lens of the transmission electron microscope, and any lens system integrated with the electron gun.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A desktop electron microscope, comprising:
an electron gun, for providing an electron beam; and
at least a wide range tunable magnetic lens, comprising:
a coil support, for winding a coil according to a central axis, the center of the coil support having a central opening for the electron beam passing through the central opening, and the coil is around the central axis, and when the coil is fed with current, a magnetic field which has a direction along the central axis is generated;
an inner pole piece, covering the coil support, having an inner top pole shoe and an inner down pole shoe, the inner top pole shoe and the inner down pole shoe located at the central opening of the coil support for forming a first magnetic-circuit gap, wherein the inner pole piece surrounds the coil;
a permanent magnet, forming an annular structure according to the central axis, the permanent magnet disposed at the outer side of the inner pole piece away from the central axis;
a first outer pole piece, adjacently disposed at an upper-side of the permanent-magnet, and extending to the central hole of the coil support for forming a first outer pole shoe; and
a second outer pole piece, adjacently disposed at the under-side of the permanent-magnet, and extending to the central hole of the coil support for forming a second outer pole shoe, wherein the first outer pole shoe and the second outer pole shoe form a second magnetic-circuit gap, wherein first outer pole piece and the second outer pole piece are spaced apart from the coil, wherein the first outer pole piece and the second outer pole piece are formed of iron or ferromagnetic metals;

wherein the inner pole piece is spaced apart from the first outer pole piece.

2. The desktop electron microscope according to claim 1, further comprising:
an outer bracket, disposed between the inner pole piece and the permanent magnet.

3. The desktop electron microscope according to claim 2, wherein the outer bracket is made of non-magnetic material.

4. The desktop electron microscope according to claim 1, wherein the inner pole piece is for providing a magnetic circuit to guide the variable magnetic field generated by the coil when an electric current is fed to the coil.

5. The desktop electron microscope according to claim 1, wherein the first outer pole piece and the second outer pole piece are used for providing a magnetic circuit to guide the magnetic field generated by the permanent magnet.

6. The desktop electron microscope according to claim 1, wherein the magnetic field generated by the coil is for wide range magnetic field adjustment.

7. The desktop electron microscope according to claim 1, wherein the inner pole piece is formed of iron or ferromagnetic metal.

8. The desktop electron microscope according to claim 1, wherein the inner pole piece is spaced apart from the first outer pole piece and the second outer pole piece.

9. The desktop electron microscope according to claim 8, wherein the inner pole piece is spaced apart from the first outer pole piece and the second outer pole piece by an outer bracket.

10. The desktop electron microscope according to claim 1, wherein the electron beam has a direction along the central axis and the direction is from a top point of the central axis to a bottom point of the central axis, the inner top pole shoe extends close to the central axis along the direction from the top point of the central axis to the bottom point of the central axis, the inner down pole shoe is away from the central axis along the direction from the top point of the central axis to the bottom point of the central axis.

11. The desktop electron microscope according to claim 1, wherein the electron beam has a direction along the central axis and the direction is from a top point of the central axis to a bottom point of the central axis, the outer top pole shoe extends close to the central axis along the direction from the top point of the central axis to the bottom point of the central axis, the outer down pole shoe is away from the central axis along the direction from the top point of the central axis to the bottom point of the central axis.

12. A wide range tunable magnetic lens, utilized for a desktop electron microscope, the wide range tunable magnetic lens comprising:
a coil support, for winding a coil according to a central axis, the center of the coil support having a central opening for the electron beam passing through the central opening, and when the coil is fed with current, a magnetic field which has a direction along the central axis is generated;
an inner pole piece, covering the coil support, having an inner top pole shoe and an inner down pole shoe, the inner top pole shoe and the inner down pole shoe located at the central opening of the coil support for forming a first magnetic-circuit gap, wherein the inner pole piece surrounds the coil;
a permanent magnet, forming an annular structure according to the central axis, the permanent magnet disposed at the outer side of the inner pole piece away from the central axis;
a first outer pole piece, adjacently disposed at an upper-side of the permanent-magnet, and extending to the central hole of the coil support for forming a first outer pole shoe; and
a second outer pole piece, adjacently disposed at the underside of the permanent-magnet, and extending to the central hole of the coil support for forming a second outer pole shoe, wherein the first outer pole shoe and the second outer pole shoe forms a second magnetic-circuit gap, wherein the first outer pole piece and the second outer pole piece are spaced apart from the coil.

13. The wide range tunable magnetic lens according to claim 12, further comprising:
an outer bracket, disposed between the inner pole piece and the permanent magnet.

14. The wide range tunable magnetic lens according to claim 12, wherein the outer bracket is made of non-magnetic material.

15. The wide range tunable magnetic lens according to claim 12, wherein the inner pole piece is for providing a magnetic circuit to guide the variable magnetic field generated by the coil when an electric current is fed to the coil.

16. The wide range tunable magnetic lens according to claim 12, wherein the first outer pole piece and the second outer pole piece are used for providing a magnetic circuit to guide the magnetic field generated by the permanent magnet.

17. The wide range tunable magnetic lens according to claim 12, wherein the magnetic field generated by the coil is for wide range magnetic field adjustment.

* * * * *